(12) United States Patent
Finney

(10) Patent No.: US 6,802,719 B2
(45) Date of Patent: Oct. 12, 2004

(54) IMPLANTATION METHOD

(75) Inventor: Adrian Finney, Uppermill Saddleworth (GB)

(73) Assignee: Zetex PLC, Oldham (GB)

( * ) Notice: Subject to any disclaimer, the term of this patent is extended or adjusted under 35 U.S.C. 154(b) by 0 days.

(21) Appl. No.: 09/947,791

(22) Filed: Sep. 6, 2001

(65) Prior Publication Data

US 2002/0048913 A1 Apr. 25, 2002

(30) Foreign Application Priority Data

Sep. 9, 2000 (GB) .............................................. 0022149

(51) Int. Cl.[7] .............................................. H01L 21/336
(52) U.S. Cl. ...................... 438/270; 438/303; 438/524
(58) Field of Search ................................ 438/302, 514, 438/524, 525

(56) References Cited

U.S. PATENT DOCUMENTS

| 5,885,878 | A | | 3/1999 | Fujishima et al. | |
|---|---|---|---|---|---|
| 5,904,541 | A | * | 5/1999 | Rho et al. | 438/433 |
| 5,970,344 | A | * | 10/1999 | Kubo et al. | 438/270 |
| 6,037,231 | A | * | 3/2000 | Yang | 438/299 |
| 6,040,212 | A | | 3/2000 | Kim | |
| 6,171,916 | B1 | * | 1/2001 | Sugawara et al. | 438/303 |
| 6,274,437 | B1 | * | 8/2001 | Evans | 438/675 |
| 6,316,806 | B1 | * | 11/2001 | Mo | 438/270 |
| 6,376,314 | B1 | * | 4/2002 | Jerred | 438/270 |
| 6,376,315 | B1 | * | 4/2002 | Hshieh et al. | 438/270 |

FOREIGN PATENT DOCUMENTS

| DE | 280 851 A1 | 7/1990 |
|---|---|---|
| EP | JP 60-247 921 A | 12/1985 |
| JP | 61112501 | * 12/1987 |
| WO | WO 97/00536 A1 | 1/1997 |
| WO | WO 00/67309 A1 | 11/2000 |

* cited by examiner

Primary Examiner—Savitri Mulpuri
(74) Attorney, Agent, or Firm—Foley & Lardner

(57) ABSTRACT

A method for implanting ions into a surface of a semiconductor structure covered by a layer of insulating material, for example into a trench wall covered by a layer of oxide. A beam of ions is directed at a glancing angle to the layer of insulating material such that a substantial proportion of ions which are implanted into the semiconductor structure surface are scattered from the beam by the layer of insulating material. It is possible therefore to implant ions into a trench wall without requiring a beam source arranged to deliver a beam at a large angle to the trench wall surface.

16 Claims, 2 Drawing Sheets

IMPLANTATION METHOD

The present invention relates to a method for implanting ions into a surface of a semiconductor structure covered by a layer of insulating material such as silicon oxide.

In UMOS power devices a gate electrode is buried in a trench formed in a semiconductor structure through which current is to be controlled which flows in the vertical direction through the structure adjacent the trench. The gate electrode only partially fills the trench, and walls of the trench above the gate electrode define source regions. The introduction of source dopant to form these regions presents various problems.

In one known UMOS device, a trench is formed in a semiconductor structure so that the trench extends through a P region into an underlying N region. The walls of the trench are then coated with an oxide insulating layer and the trenches are then partially filled with polysilicon to form the gate electrodes. The oxide layer on the trench walls is stripped back to the level of the top of the gate electrode. The upper surface of the structure from which the trenches extend is masked with a layer of oxide which extends towards but stops short of the trench edges. Thus the trench walls above the gate electrode and the surface of the structure immediately adjacent the trenches is exposed. Source dopant is introduced into the exposed surfaces. The source dopant is carried by a gas which coats the exposed surfaces and, to some extent, also delivers dopant to the upper surface of the polysilicon gate.

Gaseous dopant delivery is not easy to use when manufacturing devices which incorporate both power and signal processing components. Such devices therefore are manufactured using an implanted source dopant. One method of source dopant implantation is described in published international patent specification WO 97/00536. This shows the introduction of dopant ions into exposed trench wall surfaces above a polysilicon gate using an ion source producing an ion beam which is inclined to the trench wall surfaces so that ions can be directly implanted into those surfaces. It is noted that large angle implanters are not industry standard and if used will incur added expense. In addition, given that implantation is directly into the exposed silicon surface forming the trench walls, it is necessary to strip away the oxide layer above the polysilicon gate. Stripping the gate oxide from the side walls also etches down into the gate oxide between the polysilicon gate and the silicon structure. The resultant space between the gate and adjacent silicon then needs to be filled with high quality oxide capable of resisting the very intense electric fields generated between the gate polysilicon and the source diffusion. It would be desirable if it was not necessary to strip the trench walls above the polysilicon gate before implantation.

A method of semiconductor device fabrication is described in published international patent specification WO 99/25016 in which large angled implantation is used, implantation being effected through an oxide layer which remains in-situ on the trench walls. This avoids the problems associated with stripping back the oxide layer above the polysilicon gate but does require the use of large angled implantation equipment and therefore associated additional costs.

It is in an object of the present invention to obviate or mitigate the problems outlined above.

According to the present invention, there is provided a method for implanting ions into a surface of a semiconductor structure covered by a layer of insulating material, wherein a beam of ions is directed at a glancing angle to the layer of insulating material such that a substantial proportion of ions which are implanted into the semiconductor structure surface are scattered from the beam by the layer of insulating material.

The beam of ions is preferably directed at a glancing angle to the layer of insulating material.

The term "glancing angle" is used in the present application to indicate a beam angle relative to the surface of the insulating layer which is such that the depth of penetration of ions from the beam through the insulating layer in the direction of the beam is such that an ion which is not scattered by the insulating layer will remain within the insulating layer. Glancing angles will typically be in the range 0 to 10°. Implantation equipment is usually set at 7° from the vertical to avoid channelling effects and therefore standard implantation equipment can be used in accordance with the present invention.

The insulating material may be a layer of oxide, and the invention has particular utility when the surface into which ions are to be implanted is defined by a wall of a trench formed in the semiconductor structure. Preferably, before ion implantation, the trench is partially filled with conductive material electrically insulated from the semiconductor structure. The electrical insulation of the conductive material may be achieved by forming a layer of oxide on the trench walls. That layer of oxide may be removed and replaced by a further layer of oxide, or simply left in-situ, or thinned to provide optimum ion implantation conditions.

Implanted ions may be driven into the semiconductor structure by thermal processing after initial implantation. Some ions implanted into the insulating layer may thus migrate into the underlying structure.

Embodiments of the present invention will now be described, by way of example, with reference to the accompanying drawings, in which.

Figure 1:
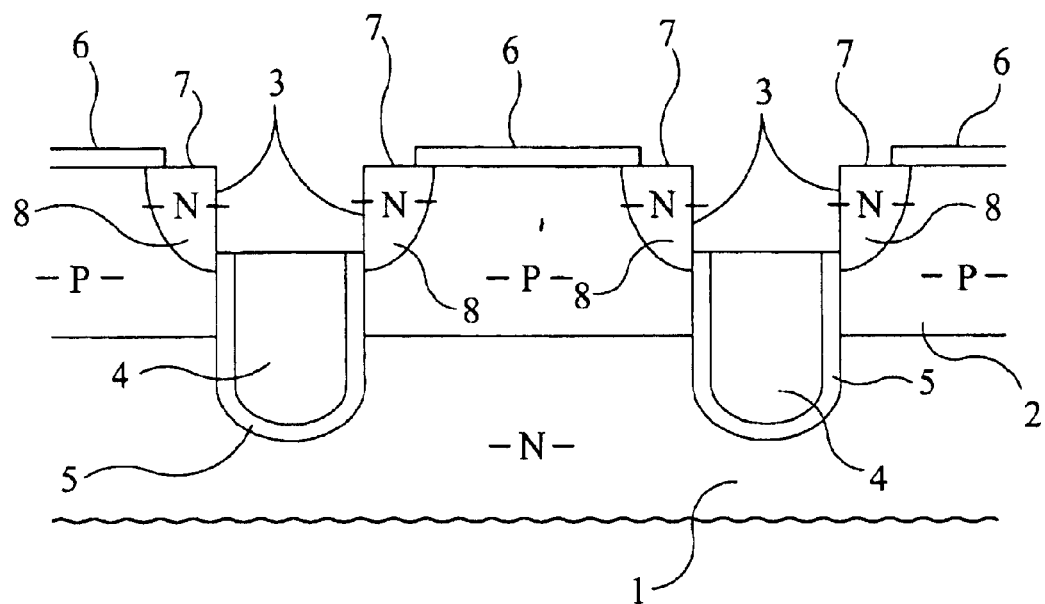
FIG. 1 is a schematic illustration of a known UMOS structure into which source region dopant is introduced via a gas.

Referring to FIG. 1, this shows a stage in a production process for a UMOS device immediately after deposition of source regions. As shown in FIG. 1, an N substrate 1 has a P region 2 adjacent an upper surface. Trenches are cut into the substrate so as to extend through the P region 2 into the N region 1. The trenches are partially filled so as to expose trench walls 3 above the filler. The filler is formed by a polysilicon gate 4 insulated from the adjacent P region 2 and N region 1 by an oxide insulator layer 5. The upper surface of the silicon structure is protected by an oxide layer 6 which is cut back from the edges of the trenches so as to leave surface regions 7 exposed.

FIG. 1 shows source regions 8 which extend from the exposed trench walls 3 and the exposed upper surfaces 7. The source regions 8 are formed by introducing source dopant via a gas which coats the exposed silicon surfaces 3 and 7 and, to some extent, delivers dopant to the polysilicon gate 4. Delivery of dopant using a gas is a process which works satisfactorily when used to manufacture power components but is difficult to use in the manufacture of devices which incorporate both power and signal processing components. In signal processing components source regions ideally should be patterned on the top surface of the silicon structure and this is difficult to achieve if the same surface incorporates structures as illustrated in FIG. 1. Difficulty arises because a masking material of oxide, nitride or the like is required to protect regions in which signal processing components are to be formed and it is difficult to remove hiss masking material without causing damage, especially when planar signal processing MOSFETs are incorporated in the device.

Figure 2:
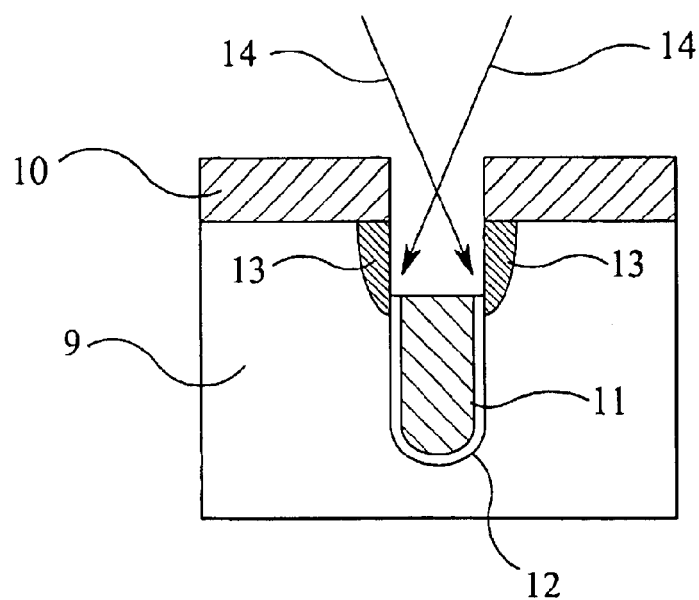
FIG. 2 is an illustration of a technique of ion implantation described in international patent No. WO 97/00536.

As an alternative to introducing source dopant via a gas, it is known to implant source regions as illustrated in FIG. 2. In FIG. 2, a silicon structure 9 supports an oxide mask 10 through which a trench is cut. The trench is partially filled with a polysilicon gate 11 insulated from the silicon structure by an oxide layer 12. Source regions 13 are formed by implantation as represented by arrows 14. The implantation angle must be such that dopant is injected directly into the trench walls and this necessitates the use of an angled implanter. Such implanters are not industry standard devices and increase costs by a factor of the order of 25 times.

Devices which incorporate both power and signal processing components can be manufactured relatively easily using implantation rather than gas dopant delivery as the top surface of the silicon can be patterned with a resist mask that can be easily removed after use without damaging underlying devices. Implantation is used in MOSFET structures where the polysilicon gate is coincident with the top surface of the silicon and the source is implanted into the top surface, but with UMOS structures in which trench walls must be implanted the above mentioned problems of additional cost arise.

There is an additional problem with both of the processes illustrated in FIGS. 1 and 2 in that the insulating layers 5 (FIG. 1) and 12 (FIG. 2) do not extend above the upper surface of the polysilicon gate. This structure is formed by initially forming an oxide layer which covers all of the walls of the trench, then partially filling the trench with gate material, and then stripping the oxide from the side walls of the trench down to the upper surface of the polysilicon gate. Great care must be exercised to maintain the integrity of the insulating layer so as to ensure that the layer is capable of resisting very intense electrical fields generated between the gate polysilicon and the adjacent source diffusion.

Figure 3:
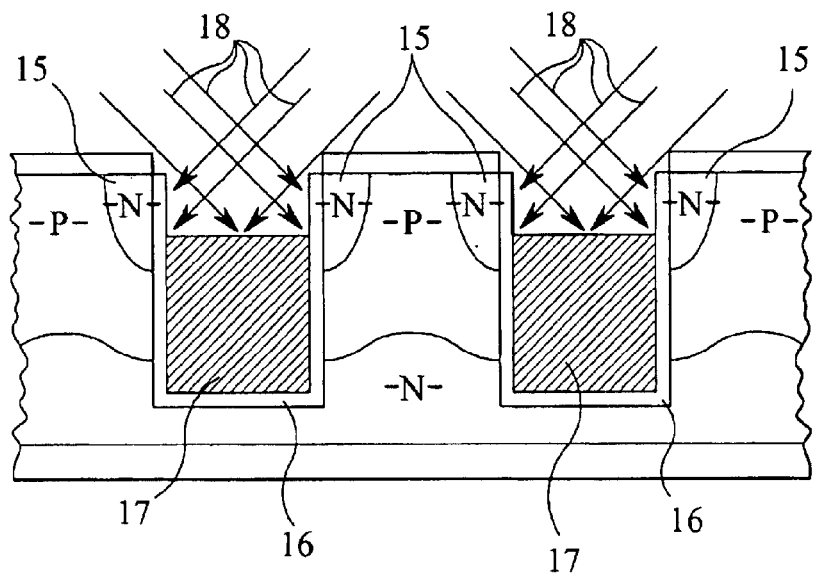
FIG. 3 is an illustration of an ion implantation technique described in international patent No. WO 99/25016.

FIG. 3 illustrates how with use of an angled implanter is known to implant source regions into the walls of trenches through a thin oxide layer covering those walls. Source regions 15 are formed in the case illustrated in FIG. 3 by direct implantation of ions though insulating layers 16 which isolate polysilicon gates 17 from the surrounding silicon structure and in addition cover the trench walls above the upper surface of the polysilicon gates 17. The direction of implantation is represented by arrows 18. Using the process illustrated in FIG. 3 avoids the disadvantage of having to strip the insulating layers 16 from the trench walls above the polysilicon gates 17 but has only been proposed using large angle implanters so as to ensure that the implanted ions pass readily through the insulating layer 16 into the underlying source regions.

The present invention is based on the realisation that the advantages in terms of processed simplicity achievable with the process described with reference to FIG. 3 can be achieved using standard implanters arranged to project ions in a direction perpendicular to or substantially perpendicular to the silicon surface into which the UMOS trenches have been formed. This is illustrated in FIG. 4 which shows the same structure as that shown in FIG. 3 but with the direction of implantation substantially perpendicular to the upper surface of the silicon structure as represented by arrows 19.

Figure 4:
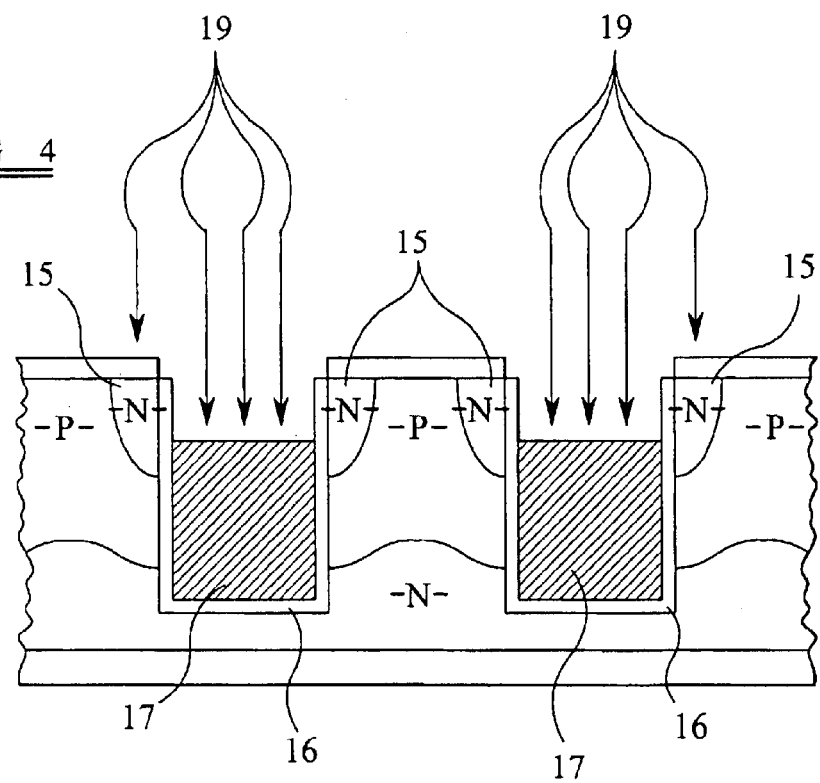
FIG. 4 illustrates ion implantation in accordance with the present invention as applied to a structure such as that illustrated in FIG. 3.

It will be appreciated from FIG. 4 that the upper surface of the silicon structure is protected by the oxide layers which extend up to the edge of the trenches. Most of the ions which enter the trenches will be injected into the upper surface of the polysilicon gates. The remainder of the ions will be injected into the upper edges of the thin oxide layers 16. Some of the ions entering the insulating layers 16 will be scattered and some of those scattered ions will be scattered into the trench walls covered by the insulating layers 16. Thus the source regions 15 will be formed by scattered ions rather than by directly implanted ions as is the case with angled implantation such as shown in FIGS. 2 and 3. Although only a small proportion of the implanted ions are scattered from the insulating layer 16 into the underlying trench side walls, by appropriate control of implantation energies and implantation dose sufficient ions can be delivered into the source regions 15 to ensure correct operation of the device.

Because implantation is relied upon, a wider range of ionic species can be used than in the case of gaseous dopant deposition. For example arsenic dopant may be used for N type source regions, BF2 for P type. Arsenic moves very slowly in silicon because of its large ion which makes further shrinking of the geometry a possibility, whilst BF2 improves gate processing. Implantation is also a better controlled technique reducing manufacturing variation.

After scattering dopant ions into the source regions, a substantial number of dopant ions will be deposited within the insulating layers 16. During subsequent processing steps some of this dopant may be driven into the underlying source regions as a result for example of thermal processing procedures. The primary delivery mechanism is however direct scattering of implanted ions from the silicon oxide lattice defined by the insulating layers 16 into the underlying silicon.

Implanting devices emit a beam of ions with a certain variation in angle, for example implanting devices based on the raster principle have as much as plus or minus 2 degrees in tilt angle. Given the crystalline nature of silicon, if an implanted ion travels exactly at right angles to the crystal structure it would travel through the lattice relatively easily, causing this ion to penetrate more deeply than expected. So as to prevent this channelling effect, implanters are usually set to 7° tilt angle from the vertical or thereabouts, and some implanters have a small amount of adjustment (typically 0 to 10° from the vertical). Experiments using a 7° angle have proved to deliver the required amount of dopant to the side walls.

An alternative method is to use an approximately 0° tilt angle, and then to rely on the fact that the ion source generates a conical beam with a cone angle of for example 2° to dope up all side walls of a trench in a single implant operation with the axis of the cone directed vertically. This would avoid the need for separate implants for each sidewall, each implant using a separate appropriately angled glancing angle. Such an approach does not induce channelling in the silicon oxide or the silicon because the silicon oxide lattice is not aligned with the silicon lattice. Ions scattered by the silicon oxide are not generally scattered in directions aligned with the silicon lattice.

Appreciation of the fact that the implanting device generates a conical beam of ions and can be used to implant ions delivered at a glancing angle to the surface to be implanted presents the possibility of depositing different concentrations of ions in different surfaces of a trench or similar wall-defining structure. For example, if an implanter generating a 2° cone angle beam was arranged such that the axis of the cone was inclined at 1° to the vertical in a vertical plane corresponding to the centre line of a trench in a horizontal surface, with the wall at one end of the trench immediately below the ion source, that wall below the ion source would be substantially parallel to one edge of the cone of ions and thus would be relatively lightly doped. In contrast, the wall at the other end of the trench would be relatively highly doped as the glancing angle of implanted ions would be greater 0°. In another example, the axis of the ion beam could be inclined at 7° to the vertical in a vertical plane corresponding to the centre line of a trench in a horizontal surface. The nearest adjacent end of the trench would not then be exposed to any ions, the sidewalls would be exposed to ions with a glancing angle of 0° or close thereto, whereas the far wall of the trench would be exposed to ions with a glancing angle of 7° or thereabouts. Thus one end of the trench would not be doped, the sidewalls of the trench would receive a relatively light doping, whereas the far end of the trench would be heavily doped. Thus, it is possible using glancing angle implantation to produce different doping concentrations in the walls of a single trench or similar formation.

Implantation through the oxide layer 16 results in a high yield. This is because stripping of the oxide layer from the trench side walls is not necessary. The oxide layer 16 which is formed in advanced of deposition of polysilicon gates 17 may be used without modification of the insulating layer on the trench walls. The layer may possibly be thinned, or may be completely stripped from the trench walls and replaced by a thinner high quality oxide layer, the replacement oxide layer avoiding the problems normally associated with stripping the gate oxide from the trench walls.

What is claimed is:

1. A method for implanting ions into a surface of a semiconductor structure covered by a layer of insulating material, wherein a beam of ions is directed at the layer of insulating material such that a substantial proportion of ions which are implanted into the semiconductor structure surface are scattered from the beam by the layer of insulating material, wherein the surface is defined by a wall of trench formed in the semicoductor structure, wherein, before ion implantation, the trench is partially filled with conductive material electrically insulated from the semiconductor structure, wherein the trench is formed in the semiconductor structure, the trench walls are oxidized, and the trench is partially filled with a conductive material, the beam of ions being directed at a glancing angle to the oxide covering the trench walls above the conductive material, and wherein the glancing angle is between approximately 0 and 10 degrees from the perpendicular to the surface of the semiconductor device.

2. A method according to claim 1, wherein the beam of ions is directed at a glancing angle to the layer of insulating material.

3. A method according to claim 1, wherein the insulating material is a layer of oxide.

4. A method according to claim 1, wherein the trench is formed in the semiconductor structure, the trench walls are oxidised, the trench is partially filled with the conductive material, oxide covering the trench walls above the conductive material is stripped away, and the walls of the trench above the conductive material are oxidised to form then insulating layer through which ions are implanted.

5. A method according to claim 1, wherein then trench is formed in them semiconductor structure, the trench walls are oxidised, the trench is partially filled with the conductive material, and the thickness of oxide covering the trench walls above the conductive material is reduced, the beam of ions being directed at a glancing angle to the remaining oxide covering the trench walls above the conductive material.

6. A method according to claim 1, wherein implanted ions are driven into the semiconductor structure by thermal processing.

7. The method recited in claim 1, wherein the semiconductor structure is a metal oxide semiconductor field effect transistor (MOSFET) structure.

8. The method recited in claim 7, wherein the MOSFET structure is a U-grooved metal oxide semiconductor (UMOS) structure.

9. A method of implanting ions into a surface of a semiconductor device wherein the semiconductor device has a surface with at least one trench gate semiconductor structure formed therein, the trench gate semiconductor structure having trench wall covered by a layer of insulating material, the method comprising directing a beam of ions at the layer of insulating material at an angle substantially perpendicular to the surface of the semiconductor device such that a substantial proportion of ions are scattered from the beam by the layer of insulating material and implanted into the trench wall, wherein then angle is between approximately 0 and 10 degrees from the perpendicular to the surface of the semiconductor device.

10. The method recited in claim 9, wherein the insulating material is oxide.

11. The method recited in claim 9, wherein, before implantation, the trench is partially filled with a conductive material electrically insulated from the trench wall.

12. The method recited in claim 9, wherein the trench wall is oxidized, the trench is partially filled with a conductive material, oxide covering the trench wall above the conductive material is stripped away, and the trench wall above the conductive material is oxidized to form the insulating layer.

13. The method recited in claim 9, wherein the trench wall is oxidized, the trench is partially filled with a conductive material, and then thickness of oxide covering then trench wall above the conductive material is reduced, the beam of ions being directed at an angle substantially perpendicular to then surface of the semiconductor device to the remaining oxide covering the trench wall above the conductive material.

14. The method recited in claim 9, the trench wall is oxidized, the trench is partially filled within a conductive material, the beam of ions being directed at an angle substantially perpendicular to the surface of the semiconductor device to the oxide covering the trench wall above the conductive material.

15. The method recited in claim 9, wherein implanted ions are driven into the trench wall by thermal processing.

16. The method recited in claim 9, wherein the trench gate semiconductor structure is a trench gate metal oxide semiconductor field effect transistor (MOSFET) structure.

* * * * *